(12) United States Patent
Lee et al.

(10) Patent No.: US 6,896,046 B2
(45) Date of Patent: May 24, 2005

(54) HEAT DISSIPATION ASSEMBLY WITH FAN MOUNTING DEVICE

(75) Inventors: Hsieh Kun Lee, Tu-chen (TW); DongYun Lee, Shenzhen (CN); Zhijie Zhang, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 46 days.

(21) Appl. No.: 10/345,692

(22) Filed: Jan. 15, 2003

(65) Prior Publication Data

US 2004/0000398 A1 Jan. 1, 2004

(30) Foreign Application Priority Data

Jun. 28, 2002 (TW) ........................................ 91209766 U

(51) Int. Cl.$^7$ .............................. F28F 7/00; H05K 7/20
(52) U.S. Cl. ........................ 165/185; 165/121; 361/697
(58) Field of Search .......................... 24/327, 457, 458; 248/510, 500, 303, 304; 165/122, 80.3, 185, 121, 76, 80.1, 67; 361/695, 697, 704, 707, 709; 174/16.1; 257/718, 719, 726, 727

(56) References Cited

U.S. PATENT DOCUMENTS 5,620,330 A * 4/1997 Pizon ........................ 439/350
5,678,627 A * 10/1997 Lee ............................ 165/80.3
6,269,001 B1 * 7/2001 Matteson et al. ........... 361/695
6,407,919 B1 * 6/2002 Chou .......................... 361/697
6,415,852 B1 * 7/2002 Lo ............................. 165/80.3
6,435,467 B1 * 8/2002 Lai ............................. 248/500
6,598,666 B2 * 7/2003 Lin ............................ 165/80.3
6,600,650 B1 * 7/2003 Lee ............................ 361/697

FOREIGN PATENT DOCUMENTS

JP              07297331 A   * 11/1995

\* cited by examiner

*Primary Examiner*—Tho V Duong
(74) *Attorney, Agent, or Firm*—Wei Te Chung

(57) ABSTRACT

A heat dissipation assembly includes a heat sink (10), a fan (70), and a mounting device for attaching the fan to the heat sink. The mounting device includes four clips (30), and four shafts (50) pivotably connecting the clips to the heat sink. Each clip includes a main body (31), a top pressing portion (39), and a bottom mounting portion (43). A tab (45) is upwardly formed from a center of the mounting portion. Two parallel connecting portions (33) extend outwardly from two side edges of the main body respectively. The tabs of the mounting portions of the clips abut against the fan in corresponding through holes (72) thereof. The pressing pardons of the clips press an upper face of the fan at corresponding through holes thereof. Thus the fan is securely mounted on the heat sink between the pressing portion and the mounting portion of each of the clips.

17 Claims, 3 Drawing Sheets

HEAT DISSIPATION ASSEMBLY WITH FAN MOUNTING DEVICE

BACKGROUND OF THE INVENTION

1. Field of the Invention

The present invention relates to a heat dissipation assembly, and more particularly to a heat dissipation assembly having a mounting device which easily and securely mounts a fan to a heat sink.

2. Description of Prior Art

A computer central processing unit (CPU) is the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPU. Typically, a heat sink having great heat conductivity is mounted on the CPU to remove heat therefrom. A fan is often attached to the heat sink to provide forced air convection therefrom.

A conventional heat dissipation assembly as shown in FIG. 3 includes a fan 1 and a heat sink 3. The fan 1 defines four through holes 2 in four corners thereof. The heat sink 3 comprises a chassis 4, and a plurality of parallel fins 5 extending upwardly from the chassis 4. A plurality of screw threads 6 is formed in two outmost fins 5 at each side of the heat sink 3. Four screws 7 are received through the through holes 2 and engaged in the screw threads 6. Thus, the fan 1 is mounted on the heat sink 3. However, engaging the screws 7 is unduly time-consuming and inconvenient. In addition, when a screwdriver is used to do this, the screwdriver can easily slip and cause damage to other nearby components of a computer. Furthermore, the outmost fins 5 are prone to deform under pressure from the screws 7. This can lead to the screws 7 becoming loosened or disengaging from the screw threads 6.

SUMMARY OF THE INVENTION

Accordingly, an object of the present invention is to provide a heat dissipation assembly which has a mounting device conveniently and reliably mounting a fan to a heat sink, the fan being easily removed from the heat sink when required.

In order to achieve the object set out above, a heat dissipation assembly of the present invention comprises a heat sink, a fan, and a mounting device for attaching the fan to the heat sink. The mounting device comprises four clips and four shafts. Each clip is generally C-shaped, and comprises a main body, a top pressing portion and a bottom mounting portion. The pressing portion and mounting portion each extend inwardly from the main body. A distal end of the pressing portion comprises an operating portion for manual operation. A tab is upwardly formed from a center of the mounting portion. Two parallel connecting portions extend outwardly from two side edges of the main body respectively. The clips are pivotably mounted to the heat sink with the shafts. The tabs of the mounting portions of the clips abut against the fan in corresponding through holes thereof. The pressing portions of the clips press an upper face of the fan at corresponding through holes thereof. Thus, the fan is securely mounted on the heat sink between the pressing portion and the mounting portion of each of the clips.

Other objects, advantages and novel features of the present invention will become more apparent from the following detailed description when taken in conjunction with the accompanying drawings, in which:

DETAILED DESCRIPTION OF THE INVENTION

Figure 1:
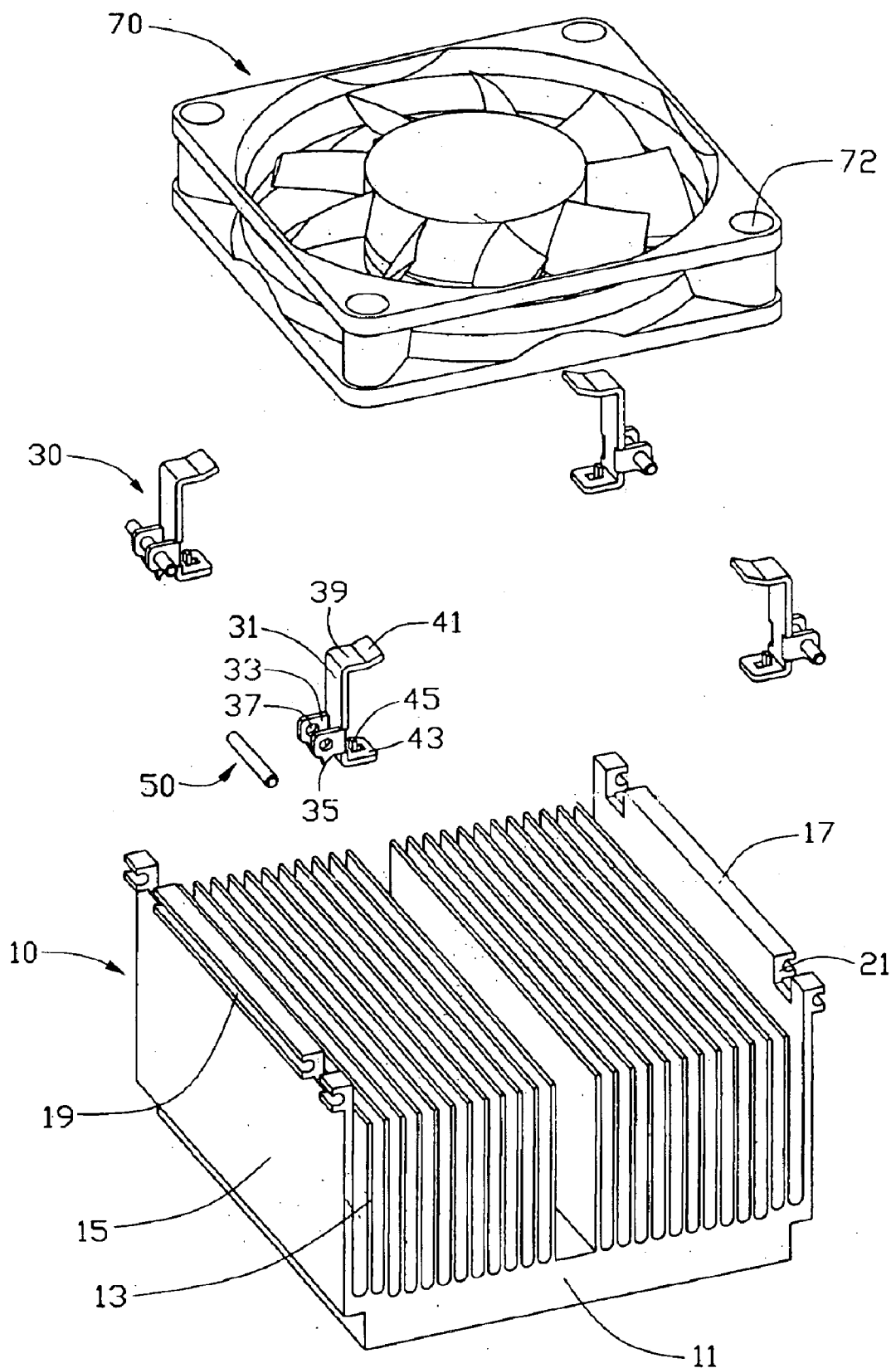
FIG. 1 is an exploded, isometric view of a heat dissipation assembly in accordance with the present invention.

Reference will now be made to the drawing figures to describe a preferred embodiment of the present invention in detail.

Referring to FIG. 1, a heat dissipation assembly of the present invention comprises a heat sink 10, a fan 70, and a mounting device for attaching the fan 70 to the heat sink 10. The mounting device comprises four clips 30, and four shafts 50 for connecting the clips 30 to the heat sink 10.

The heat sink 10 includes a chassis 11, a plurality of parallel fins 13 extending upwardly from the chassis 11, and a pair of raised fins 15. The raised fins 15 are parallel to the fins 13, and extend upwardly from respective opposite sides of the chassis 11 at respective opposite sides of the plurality of fins 13. A beam 17 is outwardly formed at a top end of each raised fin 15. A groove 19 is defined in the beam 17 at outside face thereof. Two cutouts 21 are defined in respective opposite ends of the beam 17.

Each clip 30 is generally C-shaped, and comprises a main body 31, a top pressing portion 39, and a bottom mounting portion 43. The pressing portion 39 and mounting portion 43 each extend inwardly from the main body 31. A distal end of the pressing portion 39 comprises an operating portion 41 for manual operation. A tab 45 is upwardly formed from a center of the mounting portion 43. Two parallel connecting portions 33 extend outwardly from two side edges of the main body 31 respectively. A stop 35 is downwardly formed from a bottom edge of each connecting portion 33. A pivot hole 37 is defined in each connecting portion 33.

The fan 70 is generally parallelepiped. Four through holes 72 are respectively defined in four corners of the fan 70.

Figure 2:
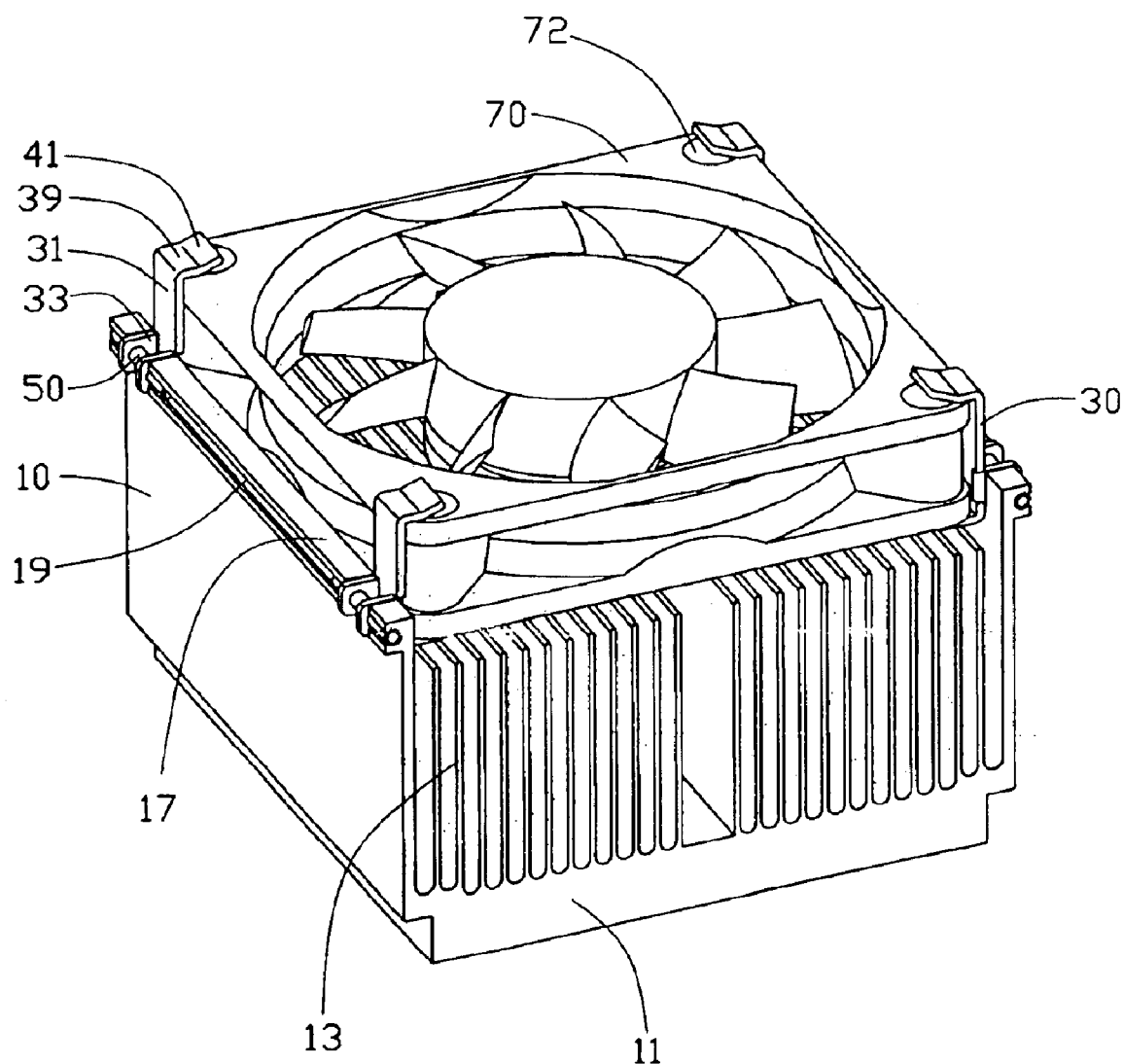
FIG. 2 is an assembled view of FIG. 1.
Figure 3:
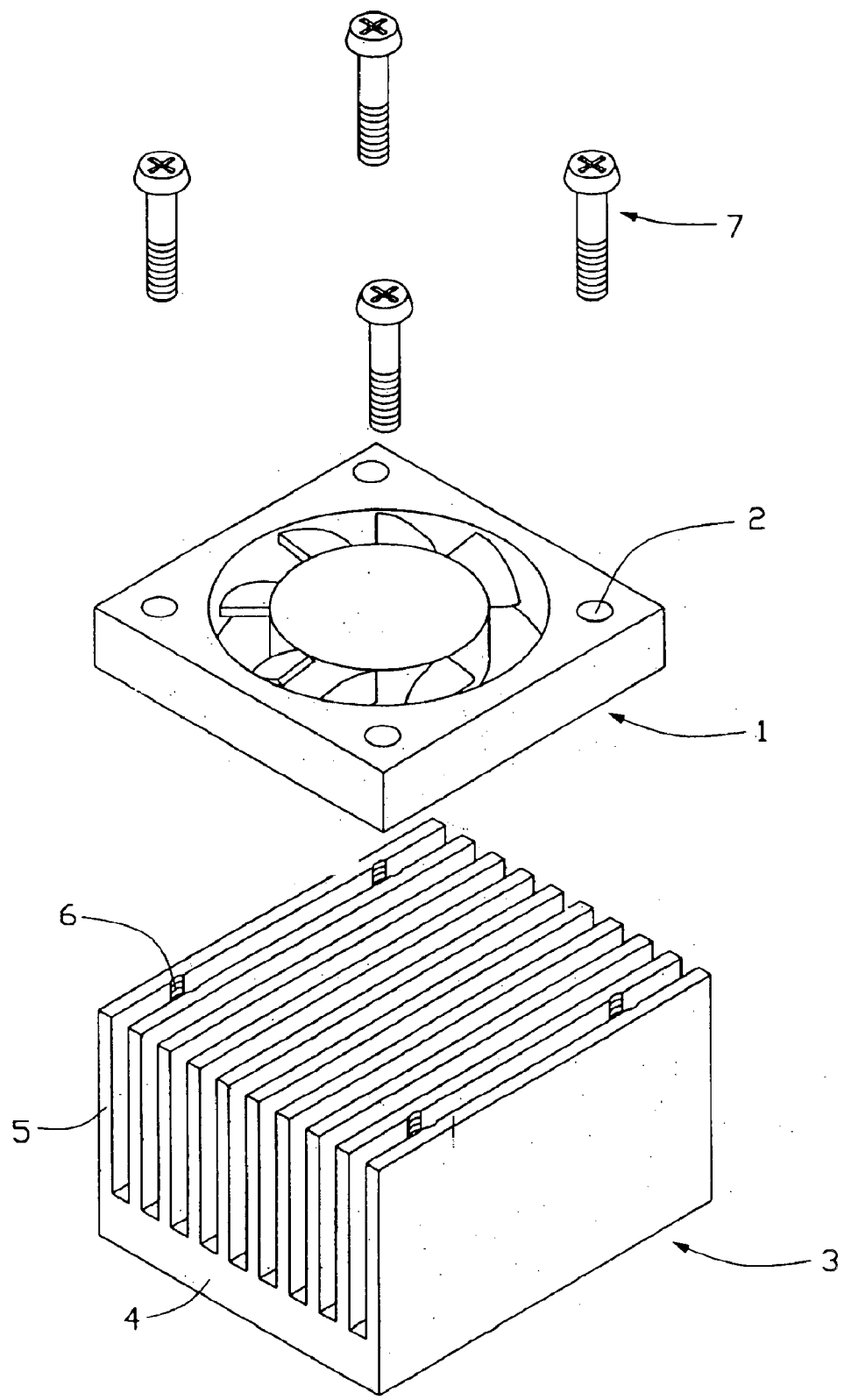
FIG. 3 is an exploded, isometric view of a conventional heat dissipation assembly.

Referring to FIG. 2, in assembly, the clips 30 are placed in the cutouts 21 of the raised fins 15 of the heat sink 10. The pivot holes 37 of the clips 30 are aligned with corresponding grooves 19 of the heat sink 10. The shafts 50 are extended into the corresponding grooves 19 and pivot holes 37 of the clips 30. The clips 30 are thus pivotably mounted to the heat sink 10. The grooves 19 are closed up by equipment (not shown), to prevent the shafts 50 escaping from the grooves 19. The clips 30 are pivoted outwardly about the shafts 50 until the stops 35 abut against the raised fins 15 of the heat sink 10. In this position, the clips 30 lean out from the heat sink 10. The fan 70 is placed on the mounting portions 43 of the clips 30 and depressed. The clips 30 are pressingly pivoted to vertical positions. The tabs 45 of the mounting portions 43 of the clips 30 abut against the fan 70 in corresponding through holes 72 thereof. The pressing portions 39 of the clips 30 press an upper face of the fan 70 at corresponding through holes 72. The pressing portions 39 press the fan 70 toward the heat sink 10 to prevent the fan 70 from moving relative to the heat sink 10 in a first direction that is perpendicular to the chassis 11. The tabs 45 received in the through holes 72 prevent the fan 70 from moving relative to the heat sink 10 in second directions that are parallel to the chassis 11. Thus, the fan 70 is securely mounted on the heat sink 10 by the clips 30.

In disassembly, the operating portions 41 of the clips 30 are pulled upwardly and outwardly, and the clips 30 are thus pivoted outwardly. The fan 70 is thereby raised and released from engagement with the tabs 45 of the clips 30. The fan 70 is then easily removed from the heat sink 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly, comprising:
   a heat sink comprising a chassis, a pair of raised fins extending from opposite sides of the chassis, and a bulge formed on an upper portion of each raised fin;
   a fan arranged at a top of the heat sink and sandwiched between said raised fins, the fan defining a pair of through holes; and
   two clips detachably mounting the fan to the heat sink, each of the clips comprising a main body pivotably attached to a corresponding bulge, and a mounting portion and a pressing portion extending from opposite free ends of the main body, a tab being formed on the mounting portion;
   wherein the pressing portions press the fan toward the heat sink to prevent the fan from moving relative to the heat sink in a first direction that is perpendicular to the chassis, and the tabs are received in said through holes respectively to prevent the fan from moving relative to the heat sink in second directions that are parallel to the chassis.

2. The heat dissipation assembly as recited in claim 1, wherein each of the bulges defines a groove and a cutout in which a corresponding clip is mounted.

3. The heat dissipation assembly as recited in claim 2, wherein each of the clips further comprises two connecting portions extending outwardly from opposite sides of the main body.

4. The heat dissipation assembly as recited in claim 3, wherein a stop is formed on a lower side of each of the connecting portions, and a pivot hole is defined in each of the connecting portions.

5. The heat dissipation assembly as recited in claim 4, further comprising a pair of shafts extending through the pivot holes of the clips respectively and received in respective grooves of the heat sink thereby mounting the clips to the heat sink.

6. The heat dissipation assembly as recited in claim 1, wherein an operating portion is provided at a distal end of the pressing portion, for facilitating operation.

7. The heat dissipation assembly as recited in claim 1, wherein the tab is formed upwardly from the mounting portion.

8. The heat dissipation assembly as recited in claim 1 wherein each of the clips is generally C-shaped and made from elastic material.

9. A heat dissipation assembly, comprising:
   a heat sink comprising a chassis, a raised fin extending upwardly from each of opposite ends of the chassis, a bulge formed on an upper portion of the raised fin, and a cutout defined in the bulge;
   two clips rotatablely mounted in the cutouts of the heat sink, each of the clips comprising a main body, a mounting portion extending inwardly from a lower end of the main body and a pressing portion extending inwardly from an upper end of the main body in a same direction as the mounting portion; and
   a fan provided at a top of the heat sink and defining a bottom plane;
   wherein the mounting portions of the clips engage with the fan to retain the fan in position parallel to the plane, and the pressing portions press the fan toward the heat sink to retain the fan in position perpendicular to the plane.

10. The heat dissipation assembly as recited in claim 9, wherein a plurality of fins extends upwardly from the chassis.

11. The heat dissipation assembly as recited in claim 9, wherein a groove is defined in the bulge.

12. The heat dissipation assembly as recited in claim 11, wherein
   a pair of connecting portions extends outwardly from opposite sides of the main body.

13. The heat dissipation assembly as recited in claim 12, wherein a pivot hole is defined in each of the connecting portions.

14. The heat dissipation assembly as recited in claim 13, further comprising a pair of shafts extending through corresponding pivot holes and received in respective grooves of the heat sink.

15. The heat dissipation assembly as recited in claim 9, wherein an operating portion is provided at a distal end of the pressing portion, for facilitating operation.

16. The heat dissipation assembly as recited in claim 9, wherein the fan defines a pair of holes, and a tab is formed upwardly from a center of the mounting portion, the tab being received in a corresponding hole of the fan.

17. The heat dissipation assembly as recited in claim 9, wherein each of the clips is generally C-shaped and made from elastic material.

* * * * *